United States Patent [19]

Yamazaki

[11] Patent Number: 4,724,159
[45] Date of Patent: Feb. 9, 1988

[54] CONDUCTIVE LAYER DEPOSITION METHOD WITH A MICROWAVE ENHANCED CVD SYSTEM

[75] Inventor: Shunpei Yamazaki, Tokyo, Japan

[73] Assignee: Semiconductor Energy Laboratory Co., Ltd., Kanagawa, Japan

[21] Appl. No.: 917,043

[22] Filed: Oct. 9, 1986

[30] Foreign Application Priority Data

Oct. 14, 1985 [JP] Japan ................... 60-228079

[51] Int. Cl.⁴ .............................. B05D 3/02
[52] U.S. Cl. ....................... 427/451; 427/47; 427/53.1; 427/54.1; 427/124; 427/126.3; 427/252; 427/253; 427/255.2
[58] Field of Search ............ 427/47, 45.1, 108, 53.1, 427/54.1, 124, 126.3, 252, 253, 255.2

[56] References Cited

U.S. PATENT DOCUMENTS 4,568,578  2/1986  Arfsten et al. ............ 427/45.1

Primary Examiner—Bernard D. Pianalto
Attorney, Agent, or Firm—Gerald J. Ferguson, Jr.; Michael P. Hoffman; Michael J. Foycik, Jr.

[57] ABSTRACT

An improved deposition method for conductive layer is shown. Adverse effects of conductive deposited material on a wall of a reaction chamber is overcome by provision of a multi-chambered system. One chamber is devoted to a resonance space in which process gas is excited by ECR. Another chamber is devoted to a reaction space in which productive gas is decomposed to proceed the deposition.

11 Claims, 1 Drawing Figure

CONDUCTIVE LAYER DEPOSITION METHOD WITH A MICROWAVE ENHANCED CVD SYSTEM

BACKGROUND OF THE INVENTION

The invention relates to a method for fabricating a conductive layer by CVD system.

There have been known, as thin film formation methods, photo enhanced CVDs, thermal CVDs and plasma enhanced CVDs. In addition are known sputtering methods for which is made of a solid state material as a source of material to be deposited, and electron beam deposition methods. In prior arts, conductive layers are formed by the sputtering and beam deposition methods, such as conductive transparent layer made of oxide or nitride of tin, indium, antimony or zinc. The reason why the conductive layers are not formed by electric power enhanced CVD methods such as plasms CVDs is that, since formation of conductive layer on the inside of a reaction chamber is inevitable, the supply of the electric power is impaired by current leakage between electrodes through the unintentionally formed conductive layer, so that the reaction is occasionally stopped. Because of this, ecomomic and commecially feasible deposition method for conductive layer is demanded.

On the other hand, photo enhanced CVD methods can be used for the deposition method for conductive layer because they need not utilize eletrical field. However, the deposition speed of the CVD method is very slow, 0.1 to 0.5 Å/sec. The method, therefore, can not meet commercial use. Also thermal CVD methods are not suitable because, according to these, the temperature of a substrate must be increased nearly to 500° C. to establish the reaction so that kinds of materials capable of being deposited are limitted.

SUMMARY OF THE INVENTION

It is therefore an object of the invention to provide an improved deposition method for conductive layer in an economically and commercially manner.

It is another object of the invention to deposit a conductive layer at high deposition speed.

DETAILED DESCRIPTION OF THE EMBODIMENT

Figure 1:
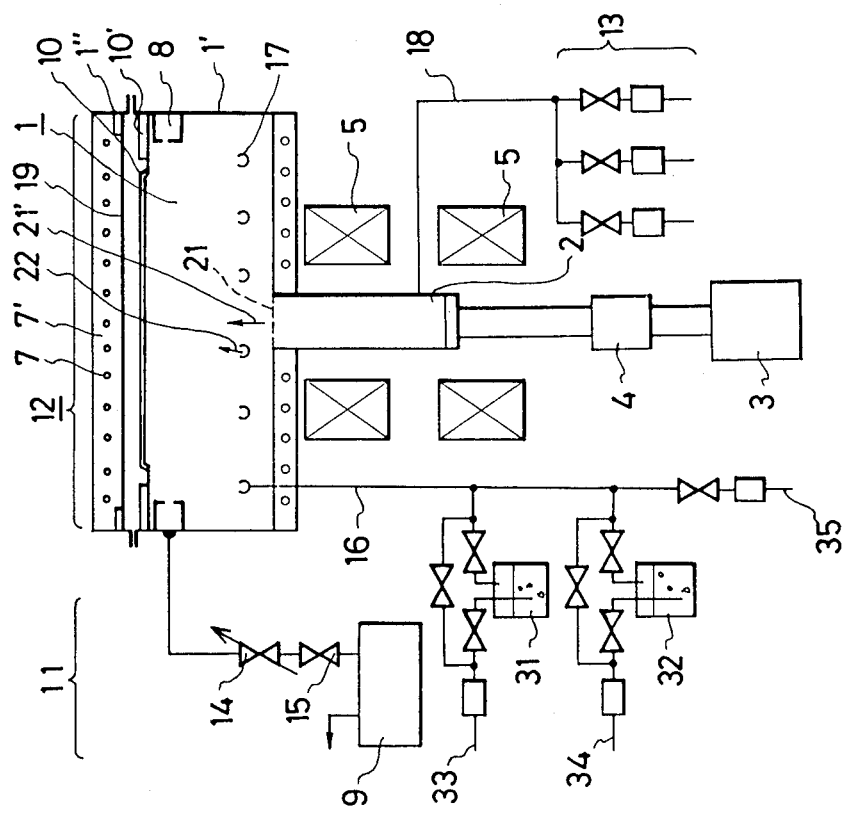
FIG. 1 is a block diagram showing an embodiment of the invention.

This description relates to CVD methods enhanced nonelectrical power. From other view point, the description relates also to a CVD method accompanied by a microwave enhanced CVD method. Microwave enhancement system, referred to as electron cyclotron resonance methods accoding to the preferred embodiments described hereinafter, are advantageous of their capability of exciting process gas at a high speed, compared to other excitement systems. According to the deposition method, it has been observed that excited reactant gas can be travelled without substantially loss of its excited energy. So the exciting system can be prepared separately from a reaction chamber in which the deposition process is carried out. Namely the deposition can be carried out at high deposition speed in virtue of microwave enhancement without any trouble by conductive product incidentially deposited on the walls.

According to the invention, process gas is excited in a resonance chamber under existense of magnetic field of a certain magnitude such as 895 gauss by supplying microwave of 2.45 Hz for example. The frequency of the microwave and the magnitude of the applied magnetic field are determined in correspondence with the molecular weight of the process gas to be excited. After being excited, the process gas is introduced into the reaction chamber to carry out the chemical reaction for the deposition in cooperation with productive gas under existense of ultraviolet light having its wave length less than 300 nm, for example, 185 nm. The process gas does not produce any material in the resonance chamber. On the other hand, although even deposition results on the inside of the reaction chamber, no adverse effect will not happen while high speed deposition rate of conductive layer is realized with the microwave enhancement.

The deposition speed according to the invention is 15 to 40 Å/sec, compared to the conventional 1 to 3 Å/sec according to spattering or CVD methods. In addition, layers of amourphous material and microcrystallite material can be formed by designing suitable system. Especially in case of conductive transparent layers, adding of halogen such as fluorine is advantageous to degenerate a fermi level into a conduction band and to make the layer of microcrystalite.

Productive gases employed in the methods according to the invention for example are $MoCl_5$ for molybdenum layer, $TiCl_4$ for titanium layer, $WF_6$ for tungsten layer, $AlCl_3$ for aluminium layer, $MoCl_5$ and $SiH_4$ or $SiH_2Cl_2$ for $MoSi_2$ layer, $TiCl_4$ and $SiH_4$ or $SiH_2Cl_2$ for $TiSi_2$ layer, $WF_6$ and $SiH_4$ or $SiH_2Cl_2$ for $WSi_2$ layer.

Because of excited productive gas having obtained energy even on the surface of the substrate, the temperature of the substrate has not to be so high, room temperature to 300° C., compared to 400° to 600° C. in vapor deposition. As a result, substrates having its poor heat-proof such as dielectric matterials can be employed as a substrate on which deposition is made according to the invention.

Referring to FIG. 1, a ECR CVD system is shown in which an deposition method according to the invention is carried out.

In the figure, a stainless steel chamber 1' is provided with a reaction space therein. The reaction chamber 1' is provided with a substrate holder 10' on the upper portion and a closure 1" having a halogen lamp heater 7 therein which irradiates and heats with an infrared light a substrate 10 held by the holder 10'. On the opposite side of the reaction chamber 1' to the closure is provided a mercury lamp 6 to irradiate the substrate with ultraviolet light. An ECR system having a resonance chamber made of artificial quartz is connected communicating with the CVD system.

Argon gas as a process gas is introduced into the resonance space from a doping system 13 through a line 18. Also carrier gases are introduced from lines 33, 34 and 35. For example, tin chloride is supplied through a bubbler 31 and a fluoride gas such as $CF_4$ diluted with $N_2O$ is supplied form the line 35. According to this example, the tin oxide layer thus deposited has 0.03 to 1 ohm/cm² with 1 micron in thickness.

In case of ITO deposition, introduced are tin chloride gas from the line 31 and induim chloride gas from the line 32. The both chloride gases may be diluted with organic gas because they tend to harm the reaction chamber 1' and a exhaust system.

To produce magnetic field in the resonance space 2, two core-less coils 5 are provided around the resonance chamber 2'. Also to supply microwave to the resonance space 2 an oscillator 3 is provided for the resonance chamber 2' with an isolator 4 therebetween. The magnetic field and the microwave are chosen of 875 gauss and 2.45 GHs for example which are culculated according to the molecular weight of the process gas.

In virtue of the microwave under the magnetic field, argon gas is ionized and pinched, resonating with the microwave, and is emitted into the reaction space 1 through meshed grids 21 which prevents gas from flowing bach to the resonance chamber. On the excited gas enterring side of the CVD system are place ring-shaped nozzles 22 through which productive reactant gas is leaked into the reaction space 1 from a line 16 of the doping system 13. As a result, the productive gas is energized by mixing with the excited argon gas.

The gaseous pressure in the resonance space 2 and the reaction space 1 is chosen at 1 to $10^{-4}$ torr, preferably at 0.03 to 0.001 torr at which the cyclotron resonance easily takes place and the productive gas can spread sufficiently throughout the reaction chamber 1. This pressure is controlled by a control valve 14 which regulates the exhaust rate of a vacuum pump 9 associated by a turbo pump.

Further, to spread the excited argon gas in the reaction space 2, a homogenizer ( not shown ) of artificial quartz may be provided between the nozzles 17 and the resonance space 2 so that the excited argon gas can enter uniformly into the reaction space 1. Such a structure is desirable for deposition of large substrate. In due course from provision of the homogenizer, some reduction of the excited energy of electron and process gas inevitably occurs by collison of the excited gas with the surface of the homogenizer resuling in decrease of the growth rate of the deposition compared with the system without the homogenizer. When high growth rate is preferred, the homogenizer is despensed with. Unnecessary gas is discarded through the exhaust system 11.

EXPERIEMT 1

The experiment has been made to demonstrate deposition of a tin oxide including fluorine accoding to the embodiment of the invention.

Argon gas as a nonproductive process gas was introduced into the reaction space 1 under 0.001 torr at a rate of 50 cc/min through the line 18. In addition, tin chloride or $Sn(CH_3)_4$ was introduced into the reaction space at a rate of 30 cc/min from the line 31. Further, oxide gas was introduced five times as much as the process gas. The oxide gas may be $O_2$, $N_2O$, $NO$, $NO_2$, $CO$, $CO_2$ and $H_2O$. Microwave of 2.45 GHz was emitted to the resonance space by power supply of 30 to 500 W. The resonance magnitude of magnetic field was 875 gauss.

Tin oxide layer was deposited on a substrate of grass pane at 250° C. as a nonsingle-semiconductor layer. The deposition speed of the layer was obtained 36 Å/sec. This speed is ten times as high as obtained by prior art LPCVD, 3 Å/sec. When the layer is desired to have texture structure, the substrate may be provided with a textured surface in advance.

The sheet resistances of the deposited layer were 130 ohm/cm$^2$ with thickness of 2000 Å and 40 ohm/cm$^2$ with thickness of 8000 Å. The deposition time was on the order of several minutes.

Further, tin oxide layer was also deposited with additive of $CF_4$ supplied to the reaction space sumultaneously with the productive gas through the line 16 at a rate 1 to 3 cc/min. In the case, the sheet resistance was 12 ohm/cm$^2$ with a thickness of 1 micron meter. The layer includes fluorine. The deposition time was 5 minutes.

In this deposition method, when $Sn(CH_3)_4$ is employed in place of tin chloride, the life time of the exhaust system 11 is expected to extend.

EXPERIMENT 2

This experiemnt relates to deposition of tin nitride. Redundant explanation already made in the description for the experiment 1 will not be repeated and only differences will be described for this embodiment.

In this experiment, nitrogen gas was introduced to the reaction space through the line 18 or 16 instead of oxide gas five times as much as oxide gas. The nitrogen gas may be $N_2$, $NH_3N_2H_2$, $NF_3$, $N_2F_6$ and those diluted with carrier gas.

Although the nitrogen gas, when introduced from the line 18, can be resonating gas, argon gas functions alone as a resonating gas in this embodiment so as to make collision with nitrogen which was eventually excited.

Tin fluoride to be introduced was diluted threefold with nitrogen gas. the mixture of nitrogen and tin compound was excited sufficiently. The deposition rate of the tin nitride layer was 16 Å which is ten times as high as obtained by CVD enhanced by plasma alone.

The sheet resistance of the layer thus deposited was 1.2 K ohm/cm$^2$ with 2000 Å in thickness. The transmissivity of the layer was 82% with reference to light with wave length of 500 nm.

As one application of the deposition in this embodiment, the tine nitride layer can be deposited on the tin oxide formed according to the experiment 1 and on which solar cell structure is formed having pin junction. In this structure, the tin nitride layer functions also to block oxide from entering the inside of the solar cell.

EXPERIEMENT 3

This experiment pretains to deposition of ITO layer. Only different explanations are made from the description for the experiement 2.

The productive gas for ITO deposition is $Sn(CH_3)_4$ diluted with $N_2$). This productive gas was introduced from the line 31 and mixed with $InCl_3$ introduced from the line 32. As a result, an indium tin oxide layer was depodited at a rate of 20 Å. Further the proportion of In, Sn, and O in the deposited ITO layer can be controlled by adjusting the introduced amount of each productive gases. The ITO layer with 3000 Å in thickness including tin at 3 weight % had its transmissivity of 86% with reference to light with a wave length of 500 nm and its sheet resistance of 23 ohm/cm$^2$.

While the present invention has been described with an embodiment and experimental according to the invention, many variations and modifications will now occur to those skilled in the art. Some examples of variations are as follow.

Argon gas can be replaced with other inert gas such as helium, neon or krypton as a process gas. As a productive gases tin halides such as $SnCl_4$, $SnF_4$ or $SnF_2$, indium halide such as $InCl_3$, antimony halides such as $SbCl_4$, $SbCl_3$ or $SnCl_5$, hydrocarbides of tin, indium or antimony such as $Sn(CH_3)_4$ or $In(CH_3)_4$. Further such as $B_2H_6$, $BF_3$, $PH_3$ or $AsH_3$ can be added to the productive gas as a doping agent.

In case of deposition on a large substrate such as of 40 cm × 120 cm, the substrate may be moved in a direction parallel therewith simultaneous with the deposition, as like spraying method in vacuum. The method can be modified and developed to become a continuous deposition method. For alternative, a plurality of ECR systems may be provided over which the substrate is shifted.

Instead of gaseous ion sources for ECR system, a solid ion source may be used. In this case, the solid ion source is disposed in the resonance chamber in which the source is sputtered by impinging of excited molecules or atoms.

The invention can be applied to solar cells, photo emitting devices, photo sensors, semiconductor lasers, electrodes of photosemiconductors or other semiconductor appliances.

The microwave enhancement system may be a cyclotron resonance type photo enhanced CVD system. In this case, the light source may be an eximer laser (wavelength = 100 to 400 nm), an argon laser, an nitrogen laser and so on.

What is claimed is:

1. A conductive layer deposition method comprising:
   a step of introducing process gas into a first chamber;
   a step of exciting said process gas by irradiating with microwave under existance of magnetic field;
   a step of introducing productive gas into a second chamber;
   a step of introducing the said excited process gas from said first chamber into the second chamber;
   a step of energizing said productive gas by mixing with said excited process gas; and
   a step of depositing a conductive layer produced from a chemical reaction of productive gas.

2. A method of claim 1 wherein said chemical reaction is set on with said productive gas and at least a part of said process gas.

3. A method of claim 1 wherein said process gas exciting step is carried out according to an electron cyclotron resonance.

4. A method of claim 1 wherein said process gas is argon gas.

5. A method of claim 1 wherein said reaction is set on at least two gaseous compounds, some of the compounds being introduced into said first chamber as said process gas and the rest being introduced into said second chamber as said productive gas.

6. A method of claim 1 wherein said productive gas or said process gas is diluted with inert gas.

7. A method of claim 1 wherein at least one component of said conductive layer comes from a solid ion source which is disposed in said first chamber.

8. A method of claim 1 wherein said conductive layer is a conductive transparent layer.

9. A method of claim 8 wherein said transparent layer is a transparent oxide layer.

10. A method of claim 9 wherein said oxide layer is a indium tin oxide layer or a tin oxide.

11. A method of claim 8 wherein said transparent layer is made of tin nitride, molybdenum, titanium, tungsten, aluminium, $MoSi_2$, $TiSi_2$ or $WSi_2$.

* * * * *